United States Patent
Turpuseema et al.

(10) Patent No.: US 9,468,108 B2
(45) Date of Patent: Oct. 11, 2016

(54) METHOD AND STRUCTURE FOR FORMING CONTACT PADS ON A PRINTED CIRCUIT BOARD USING ZERO UNDER CUT TECHNOLOGY

(71) Applicants: Dan Turpuseema, Whitehouse Station, NJ (US); James V. Russell, New Hope, PA (US)

(72) Inventors: Dan Turpuseema, Whitehouse Station, NJ (US); James V. Russell, New Hope, PA (US)

(73) Assignee: Abacus Finance Group LLC, New York, NY (US)

( * ) Notice: Subject to any disclaimer, the term of this patent is extended or adjusted under 35 U.S.C. 154(b) by 360 days.

(21) Appl. No.: 13/987,440

(22) Filed: Jul. 25, 2013

(65) Prior Publication Data
US 2014/0069704 A1    Mar. 13, 2014

Related U.S. Application Data

(60) Provisional application No. 61/743,596, filed on Sep. 7, 2012.

(51) Int. Cl.
| | |
|---|---|
| *H05K 1/11* | (2006.01) |
| *H05K 3/00* | (2006.01) |
| *H05K 3/42* | (2006.01) |
| *H05K 3/40* | (2006.01) |
| *H05K 3/24* | (2006.01) |

(52) U.S. Cl.
CPC .............. *H05K 3/425* (2013.01); *H05K 1/113* (2013.01); *H05K 1/115* (2013.01); *H05K 3/0094* (2013.01); *H05K 3/4007* (2013.01); *H05K 3/243* (2013.01); *H05K 3/427* (2013.01); *H05K 2201/0959* (2013.01); *Y10T 29/49156* (2015.01)

(58) Field of Classification Search
CPC .......................... H05K 1/113; H05K 3/0094
See application file for complete search history.

(56) References Cited

U.S. PATENT DOCUMENTS

2006/0225917 A1* 10/2006 Hu ................................ 174/257
2009/0315190 A1* 12/2009 Kikuchi et al. ............... 257/778

* cited by examiner

*Primary Examiner* — Jeremy C Norris
(74) *Attorney, Agent, or Firm* — Richard B. Klar, Esq.; Law Office Richard B Klar

(57) ABSTRACT

A method and an apparatus for forming a contact pad on a printed circuit board over a filled plate via or blind in which an additional metallic or a non metallic coating is applied to a final surface finished plate which encapsulates the side walls of the wear resistant surface plate, and also covers the side walls of the metal layer plated onto the filled via and the wrap around plated metal which was plated in the via and onto the surface of the base metal to the extents of the pad geometry. This prevents subsequent undermining through the etching process and ensuring the integrity and reliability of the vias' electrical connection when an underlying base metal such as but not limited to copper and the surface plated metal are formed when plating metal in the via and consequently onto the surface.

26 Claims, 13 Drawing Sheets

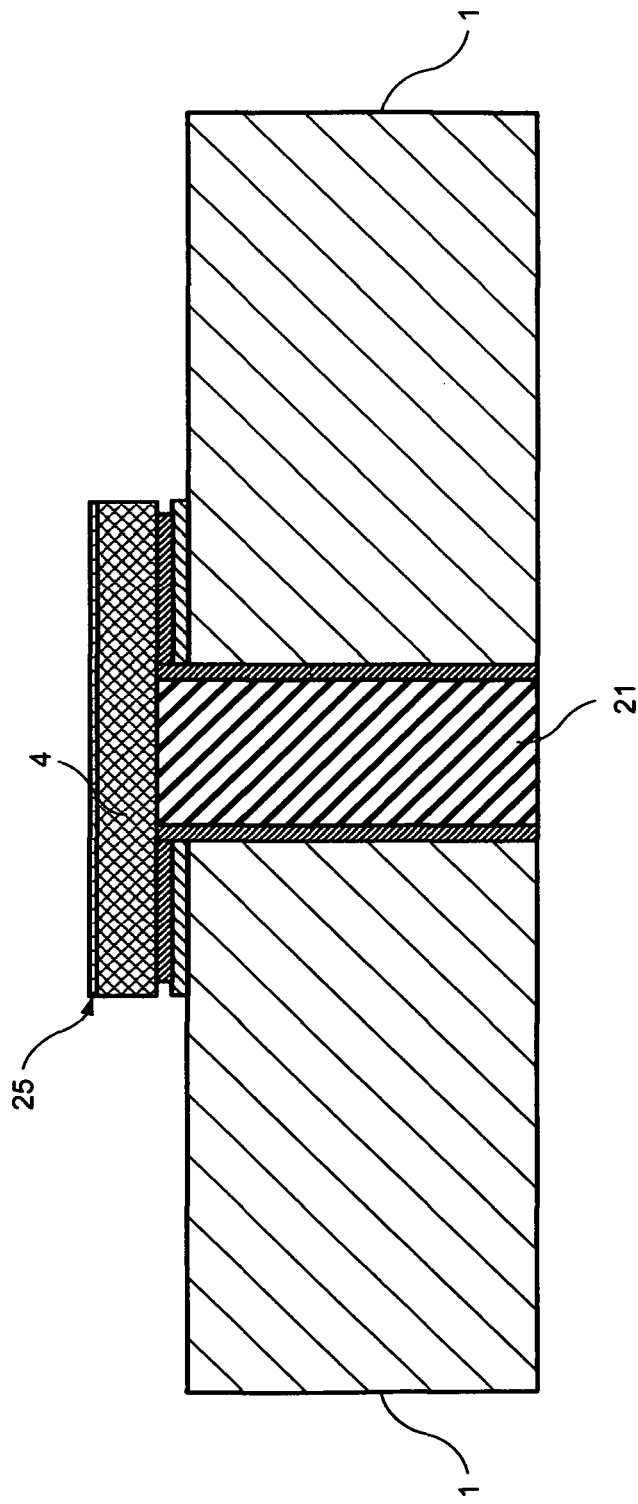

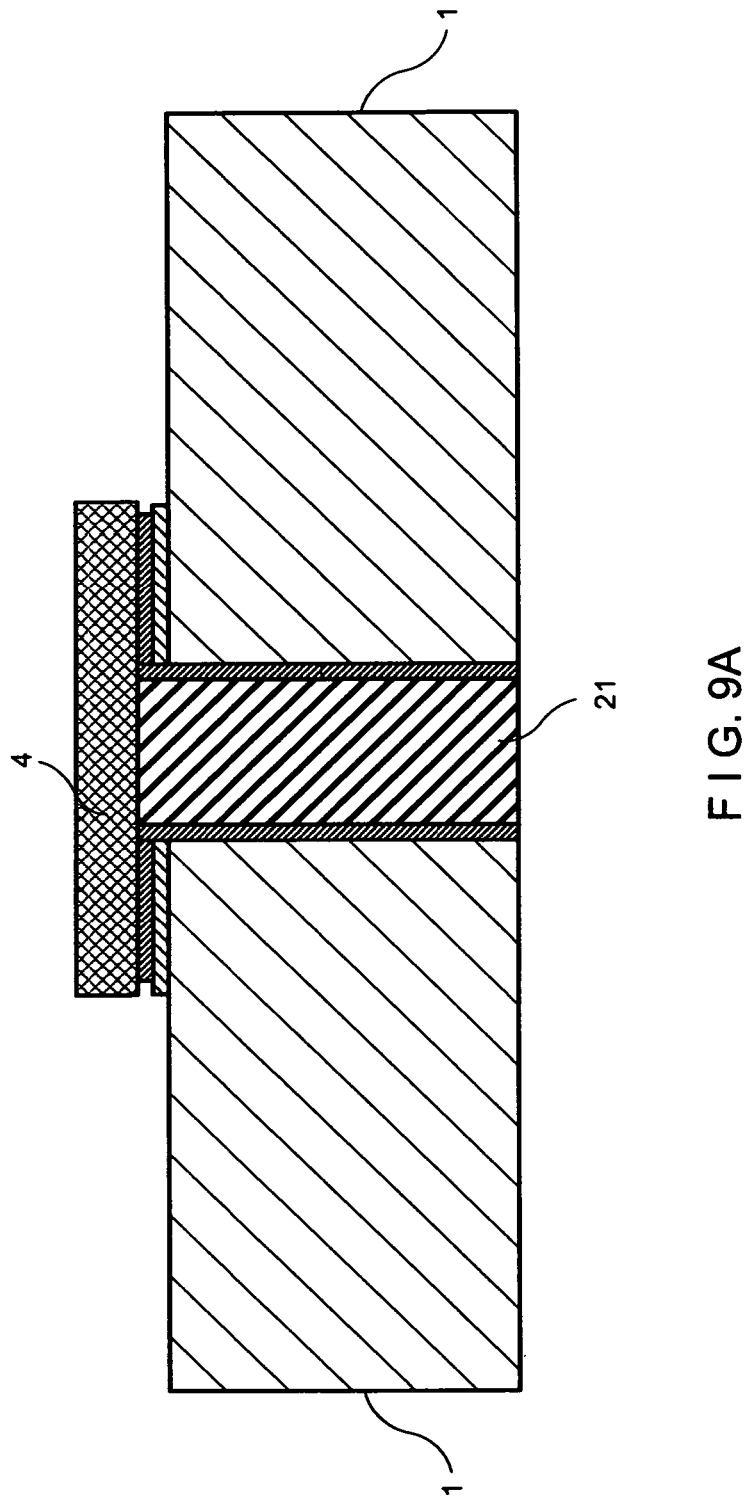
F I G. 9A

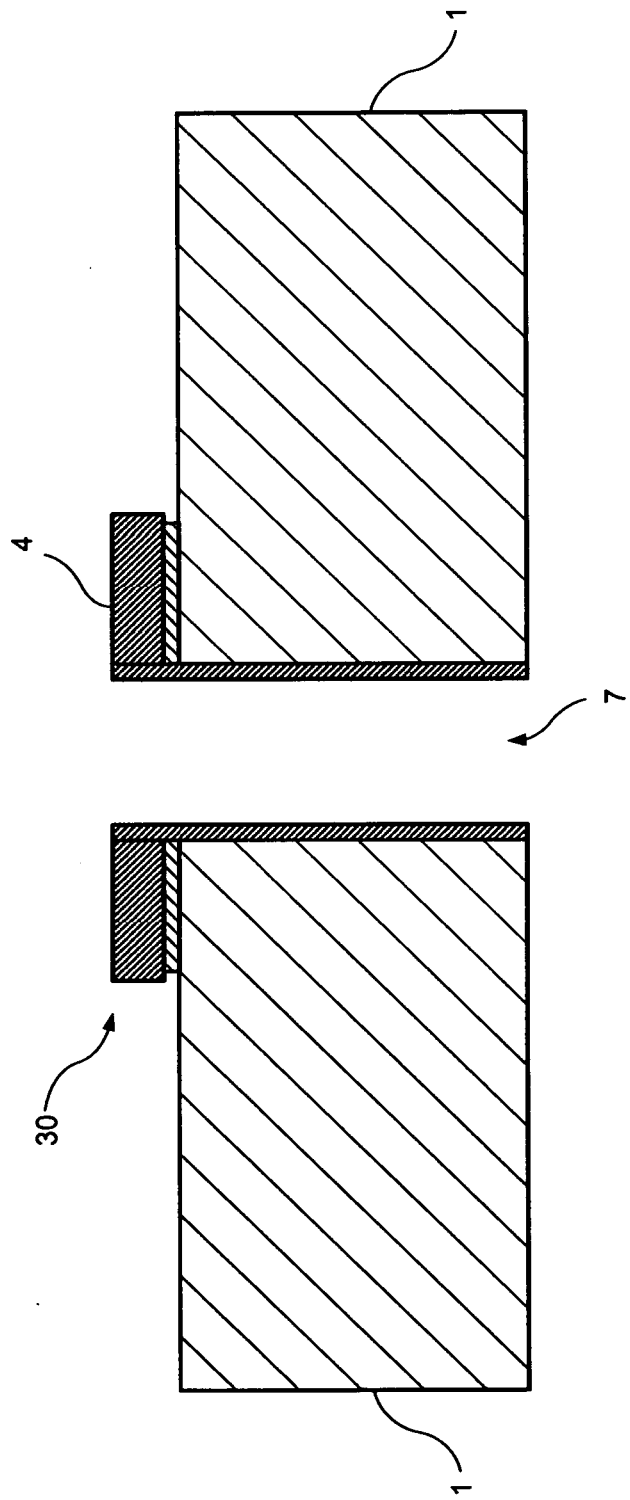
F I G. 10

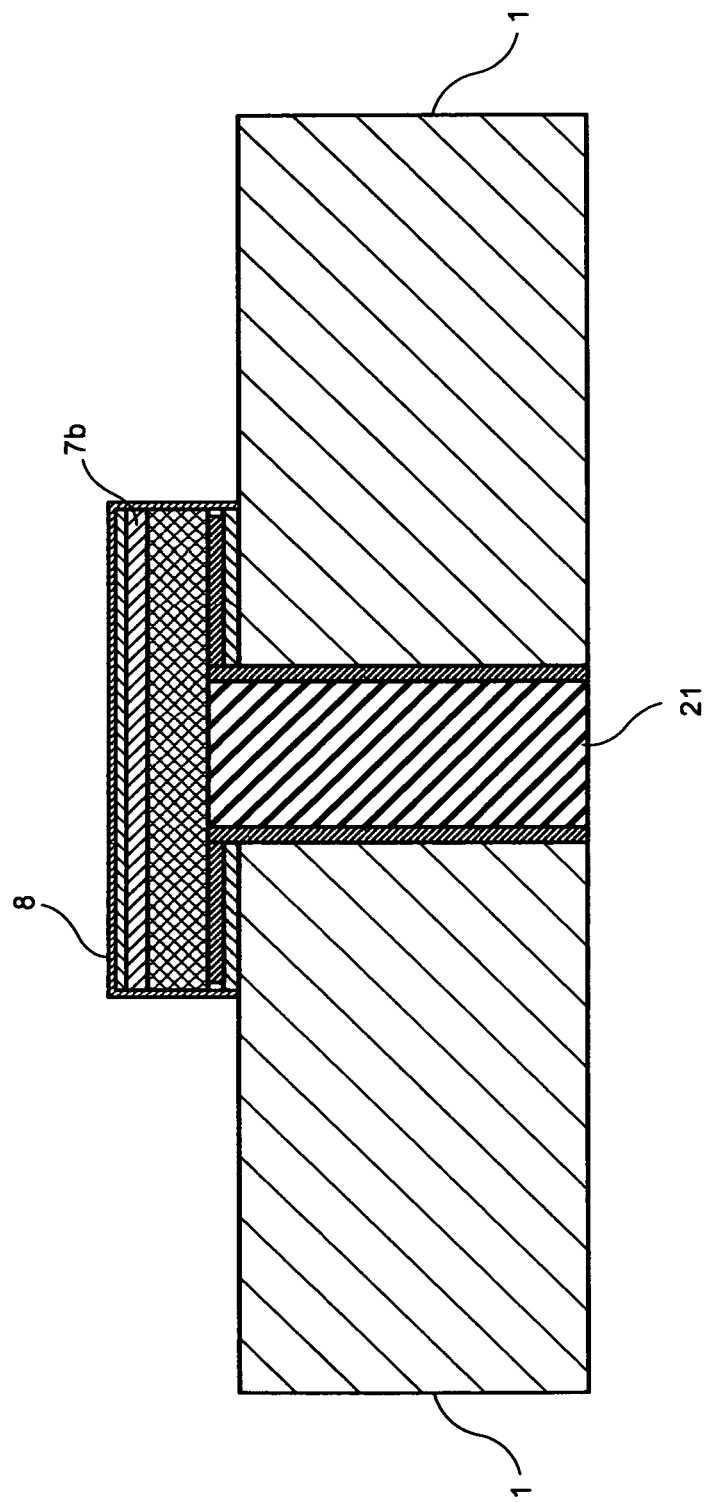

METHOD AND STRUCTURE FOR FORMING CONTACT PADS ON A PRINTED CIRCUIT BOARD USING ZERO UNDER CUT TECHNOLOGY

RELATED APPLICATIONS

This is a non provisional application of provisional application Ser. No. 61/743,596 by Dan Turpuseema and James V. Russell filed Sep. 7, 2012.

BACKGROUND

1. Field

The present invention relates to a method and structure for forming contact pads or circuits on a printed circuit board using a zero undercut technology. In particular, the present invention relates to a method and a structure for forming contact pads on a printed circuit board over a plated and filled via in which additional metallic or non-metallic coating is applied to the side walls and top surfaces of said pads' metal layers that were plated onto the filled via to the extents of the pad geometry resulting in a zero undercut of the plated features over the filled via. In an alternative embodiment of the present invention employing an unfilled via the metallic or non metallic coating is applied to the outer surfaces of the plated metal layers which extend around and down into the unfilled via.

2. The Related Art

The traditional printed circuit board filled via, or via in pad technology surface contact pads as well as unfilled vias and all outer layer circuit features suffer from poor edge definitions due to the undercut that is traditionally associated with these features. Such features, typically in the case of contact pads, are formed on a printed circuit board by subtractive etching using a hard gold plated layer over a Ni plated layer acting as an etch resist defining the pad geometry of the underlying base metal, typically copper. Many other metals can be utilized as the wear resistant etch resist including but not limited to Palladium, and rhodium. In the case of via-in-pad technology, traditionally a blind or through via or hole is formed in a printed circuit board (FIG. 1) that is subsequently plated with an electro-less plating process to form a thin layer of metallization such as, copper, conductive polymer or other conductive material such as graphite, in the via. In the case of electroless copper, the copper is also deposited on the base copper layers of the board's external surface. This prepares the vias for subsequent electro-plating operations. Next, a conductive metal, typically copper, is electro plated in the vias and subsequently on the surface of the panel that contains the board (FIG. 2). Boards are typically built into a larger process panel and then removed from this panel in a later routing step. This plating step is called a "panel plate" step, due to the fact that the entire surface of the panel is plated. Once a sufficient amount of copper is plated in the vias, then subsequently on the surface, a filling step occurs in which a fill material, typically an epoxy, is filled in the vias and removed from the surface and planarized to the surface in a sanding step FIG. 3.

At this point, an electro-less plating step of metal or conductive polymer is formed on the surface of the panel to prepare the surface of the panel for the subsequent electro-plating step. This step is primarily used to initiate the surface of the epoxy fill in order to electro plate in subsequent steps. This step may be unnecessary if a conductive fill material is used such as but not limited to CB100 from DuPont Corporation. Next, a plating mask, typically a photosensitive mask, is applied to the surfaces of the board and removed from just the areas that will define the final shape of the contact pads and, in many cases, all the remaining circuitry. The panel is then electro-plated on the exposed pattern and filled epoxy surface. This mask and plate step is typically referred to as the pattern-plating step. After plating metal on the exposed pattern, typically copper, a final plating finish, typically nickel and gold, is plated on the exposed surface (FIG. 4.) The photosensitive mask is removed at this stage.

Viewing the contact pads from a cross sectional view (FIG. 4), the base copper can be seen extending across the entire surface of the board, with a thin electro-less metallization across the base copper and into the vias. Panel plating extends across the base copper and into the vias, epoxy fill is seen inside the vias and an additional electroless metallization is seen across the panel plate and the epoxy fill. In the case of some electro-less conductive polymers this layer would only be visible on the planerized epoxy surface. A layer of metallization (Pattern Plate) can be seen on top of the planerized epoxy and across the extents of the circuit pattern. This circuit pattern metal would extend beyond the base metal layers typically by 2-3 mils, culminating with layers of nickel-gold as the permanent etch resist. It is important to note that the sidewalls of the pattern-plated metal are exposed and are subject to the negative effects of the subsequent etching process. This etching process is typically a chemical etch that dissolves away the base metal and the exposed sidewall metal of the pattern plated circuitry. The nickel and gold layers, being impervious to this etching process, remain and protect most of the metallization under it. However, the chemical etchant not only etches metal layers in the z-axis but also in the x and y axis, approximately equally. Therefore, the pad and circuitry dimensions, including the contact pads under the nickel-gold layers, is severely under-minded or under-cut from all directions (as seen in FIG. 7). This under-cutting reduces the underlying target pad for contact by a spring-loaded pin as used in the test market. It also creates a shorting risk if the spring pin contacts the nickel/gold overhang and breaks it off with the nickel gold sliver potentially falling between nets on the board's contact area. Further, this undermining affects the shape of the underlying circuitry creating unwanted electrical effects on high-speed transmission lines. It would therefore be desirable to provide a method and a structure that avoids these aforementioned shortcomings.

SUMMARY

The present invention relates to a method and structure for forming contact pads or circuits on a printed circuit board using a zero undercut technology. In particular, the present invention relates to a method and a structure for forming contact pads on a printed circuit board over a plated and filled via in which additional metallic or non-metallic coating is applied to the side walls and top surfaces of said pads' metal layers that were plated onto the filled via to the extents of the pad geometry resulting in a zero undercut of the plated features over the filled via.

In a second embodiment of the present invention, a temporary etch resist is applied to the contact pads or circuit features' tops and much of its side walls to protect it from the harmful, undercutting effects of the etch process. Being a temporary resist, the resist can be removed and the pads or circuit features are made ready to receive a suitable final finish with characteristics common for its intended application.

In a third embodiment of the present invention employing an unfilled via the metallic or non metallic coating is applied to the outer surfaces of the plated metal layers which extends around and down into the unfilled via.

In a fourth embodiment of the present invention, a temporary etch resist is applied to the final surface finish of the contact pads or circuit features and much of its side walls to protect it from the harmful, undercutting effects of the etch process. Being a temporary etch resist the resist is then removed exposing a contact pad or circuit feature with its final finish already in place with predominately straight side walls.

BRIEF DESCRIPTION OF THE DRAWINGS

FIGS. 8-9b illustrates a sectional view of a second embodiment of the present invention in which a temporary metallic or non metallic etch resist layer is applied to the tops and side walls of the metal layer (pattern plate) which is plated onto the filled via and on top of a portion of the wrap around plated metal (panel plate) which is plated in the via and onto the surface of the base metal. After etch, this results in a very slight undercut of the panel-plated metal, virtually no undercut of the base metal and no undercut of the pattern plated metal. Leaving the pads ready to accept a suitable final surface finish; and FIG. 11 illustrates a fourth embodiment of the present invention in which a temporary etch resist is applied to the final surface finish of the contact pads or circuit features and much of its side walls to protect it from the harmful, undercutting effects of the etch process. Being a temporary etch resist the resist is then removed exposing a contact pad or circuit feature with its final finish already in place with predominately straight side walls.

DETAILED DESCRIPTION OF THE PREFERRED EMBODIMENT(S)

Figure 1:
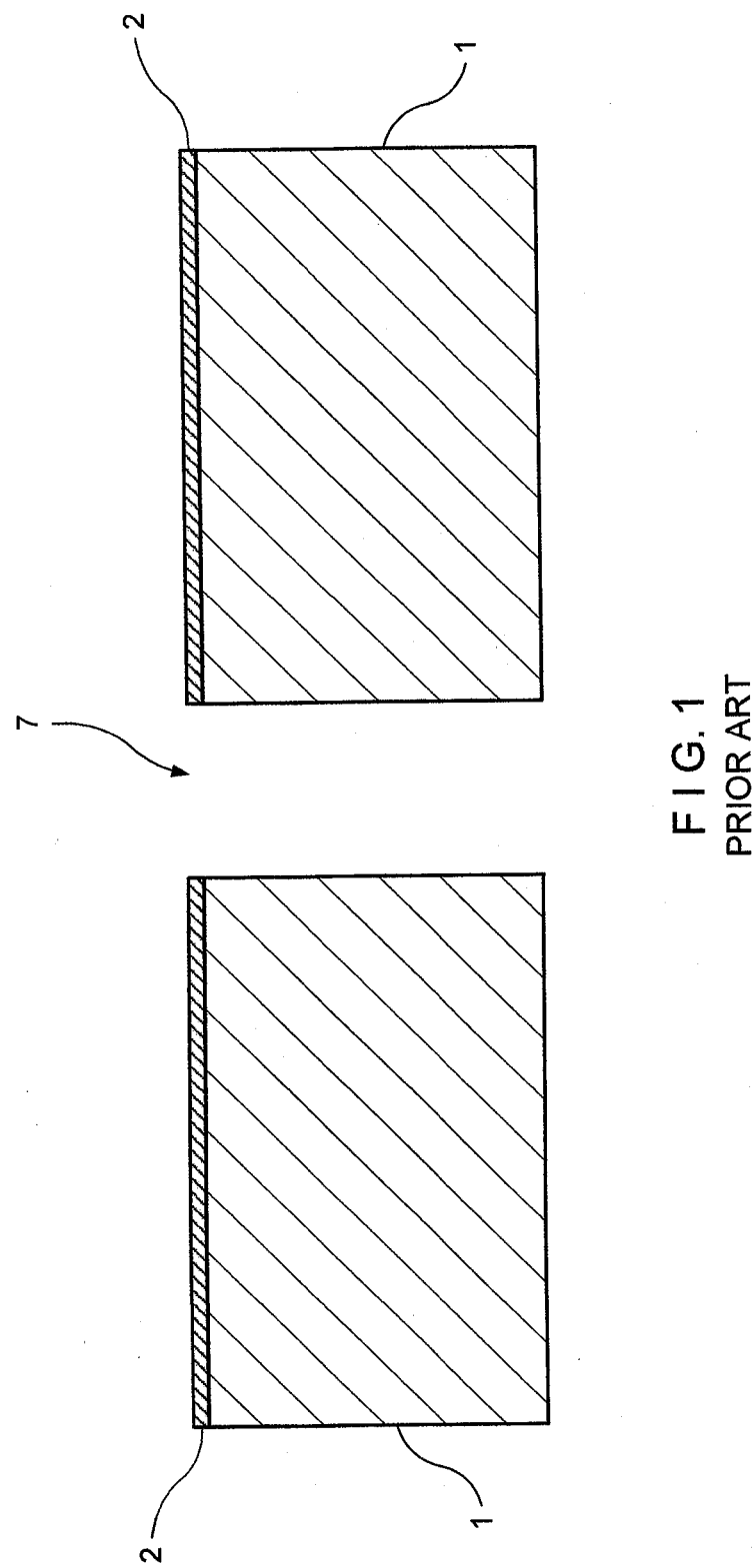
FIGS. 1-4 and 7 illustrate sectional views of a traditional process and structure for forming a contact pad on a printed circuit board over a filled plate via.
Figure 2:
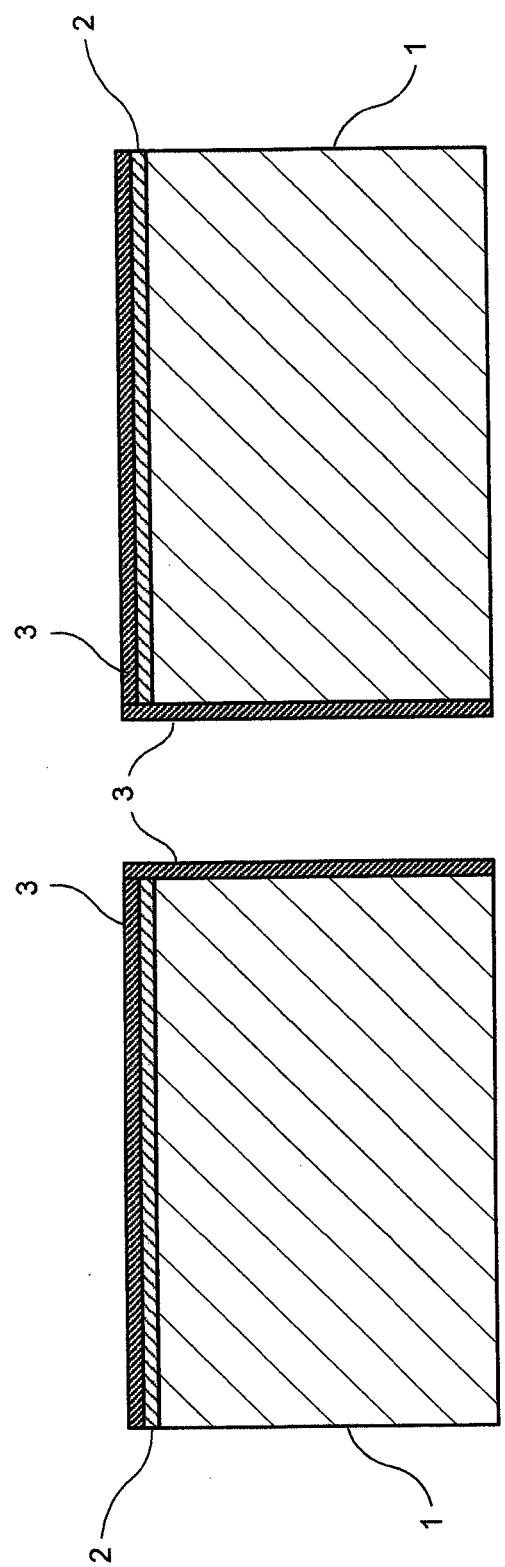
Figure 3:
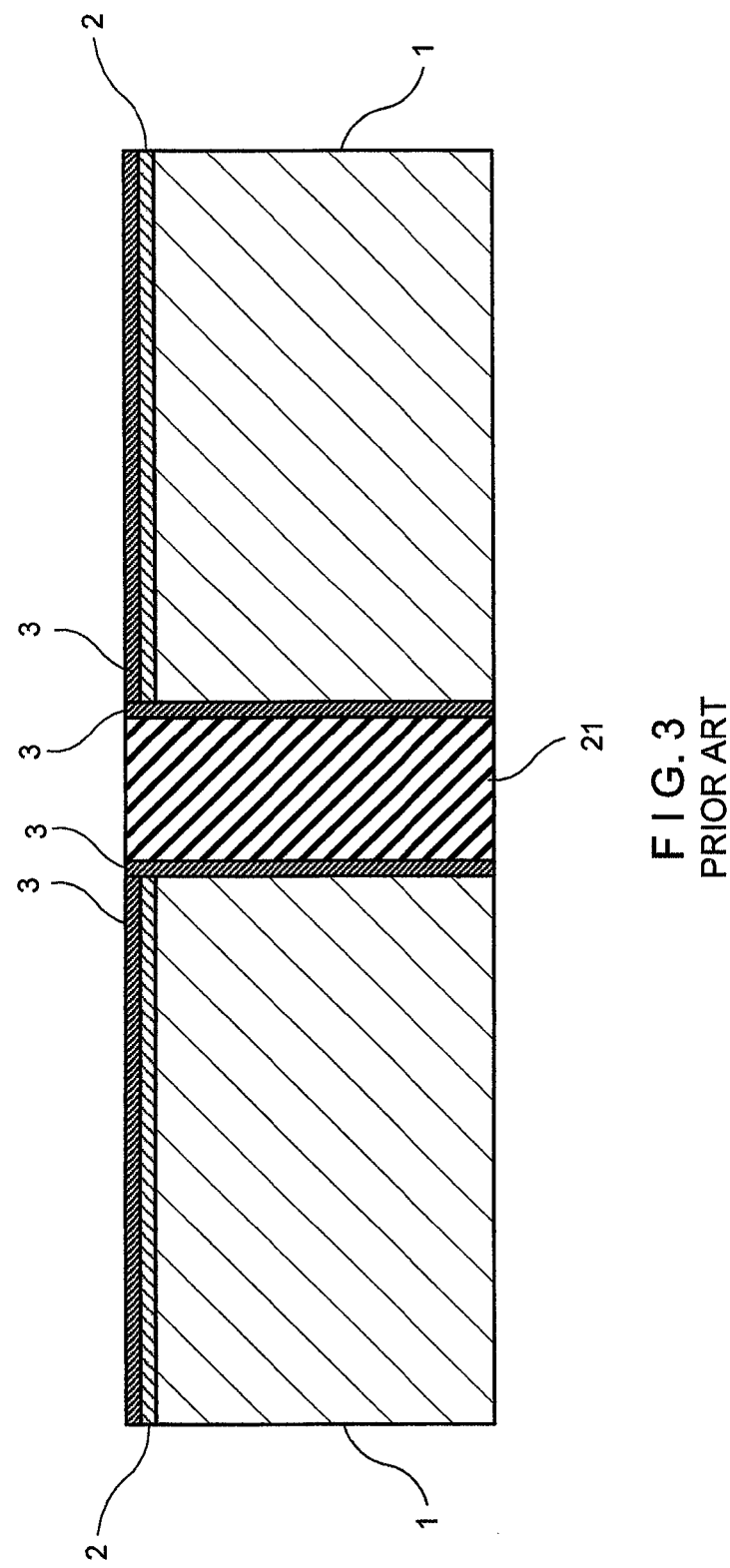

Referring now to FIGS. 1-11 of the drawings, FIGS. 1-4 and 7 shows a conventional process and structure for forming a contact pad 7 on a printed circuit board (FIG. 7) over a plate filled via 7. Typically, contact pads 7b are formed on a printed circuit boards 1 by subtractive etching using a hard gold plated layer over a Ni plated layer acting as an etch resist 5 (with Gold on top of the Nickel layer) defining the pad geometry of the underlying base metal 2, typically copper. Many other metals can be utilized as the wear resistant etch resist 5 including Palladium, and rhodium. As shown in FIG. 1 for the case of via-in-pad technology, traditionally a blind or through via 7 is formed in a printed circuit board 1 which is subsequently plated with an electro-less plating process to form a thin layer of metallization or a conductive polymer or other conductive material such as graphite. In the case of electroless copper, the copper is also deposited on the base copper layers 2 of the board's 1 external surface. This prepares the vias 7 for subsequent electro-plating operations. A conductive metal 3, typically copper, is next electro plated in the vias 7 and subsequently on the surface of the panel that contains the board 1 (as shown in FIG. 2). Boards 1 are typically built into a larger process panel and then removed from this panel in a later routing step. This plating step is called a "panel plate" step due to the fact that the entire surface of the panel is plated. Once a sufficient amount of copper is plated in the vias 7, and subsequently on the surface, a filling step occurs in which a fill material 7a, typically an epoxy, is filled in the vias 7 and removed from the surface and planarized to the surface in a sanding step (see FIG. 3).

An electro-less plating step, metal or conductive material is then formed on the surface of the panel to prepare the surface of the panel for the subsequent electro-plating step. This step is primarily used to initiate the surface of the epoxy fill 7a in order to electro plate in subsequent steps. This step may be unnecessary if a conductive fill material is used such as CB100 from DuPont Corporation. Next, a plating mask 15, typically a photosensitive mask, is applied to the surfaces of the board 1 and removed from just the areas that will define the final shape of the contact pads 7b and, typically, all the remaining circuitry. The panel is then electro-plated on the exposed pattern and filled epoxy surface. This mask and plate step is typically referred to as the pattern-plating step.

Figure 4:
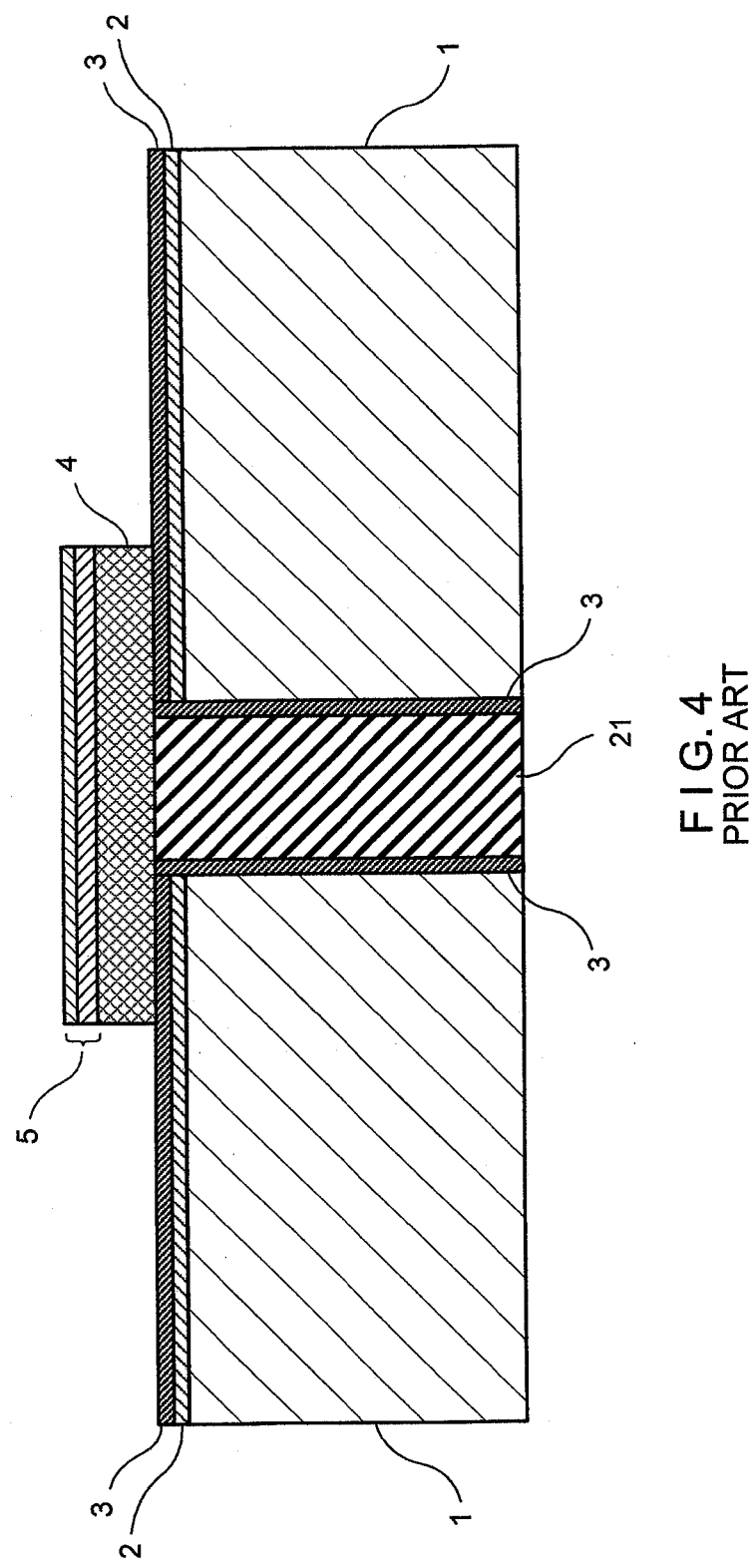

After plating metal on the exposed pattern, typically copper, a final plating finish, typically nickel and gold, is plated on the exposed surface (FIG. 4). The photosensitive mask is removed at this stage. Viewing the contact pads 7b from the sectional view as shown in FIG. 4, the base copper 2 can be seen extending across the entire surface of the board 1 with a thin electro-less metallization across the base copper and into the via. Panel plating also extends across the base copper 2 and into the via 7, and epoxy fill 7a is seen the via 7. Further, there is an additional electroless metallization across the panel plate and the epoxy fill 7a. In the case of some electro-less conductive polymers this layer would only be visible on the planerized epoxy surface. A layer of metallization 4 (Pattern Plate) can be seen on top of the planerized epoxy and across the extents of the circuit pattern. This circuit pattern metal would be proud of the base metal layers culminating with layers of nickel-gold as the permanent etch resist. It is important to note that the sidewalls of the pattern-plated metal are exposed and are subject to the negative effects of the subsequent etching process. This etching process is typically a chemical etch that dissolves away the base metal and the exposed sidewall metal of the pattern plated circuitry. The nickel and gold layers, being impervious to this etching process, remain and protect most of the metallization under it. However, the chemical etchant not only etches metal layers in the z-axis but also in the x and y axis, approximately equally. Therefore, the pad and circuitry dimensions, including the contact pads 7b under the nickel-gold layers 5, is severely underminded or under-cut from all directions (see FIG. 7). This under-cutting reduces the underlying target pad for contact by a spring-loaded pin as used in the test market. It also creates a shorting risk if the spring pin contacts the nickel/gold 5.

Figure 5:
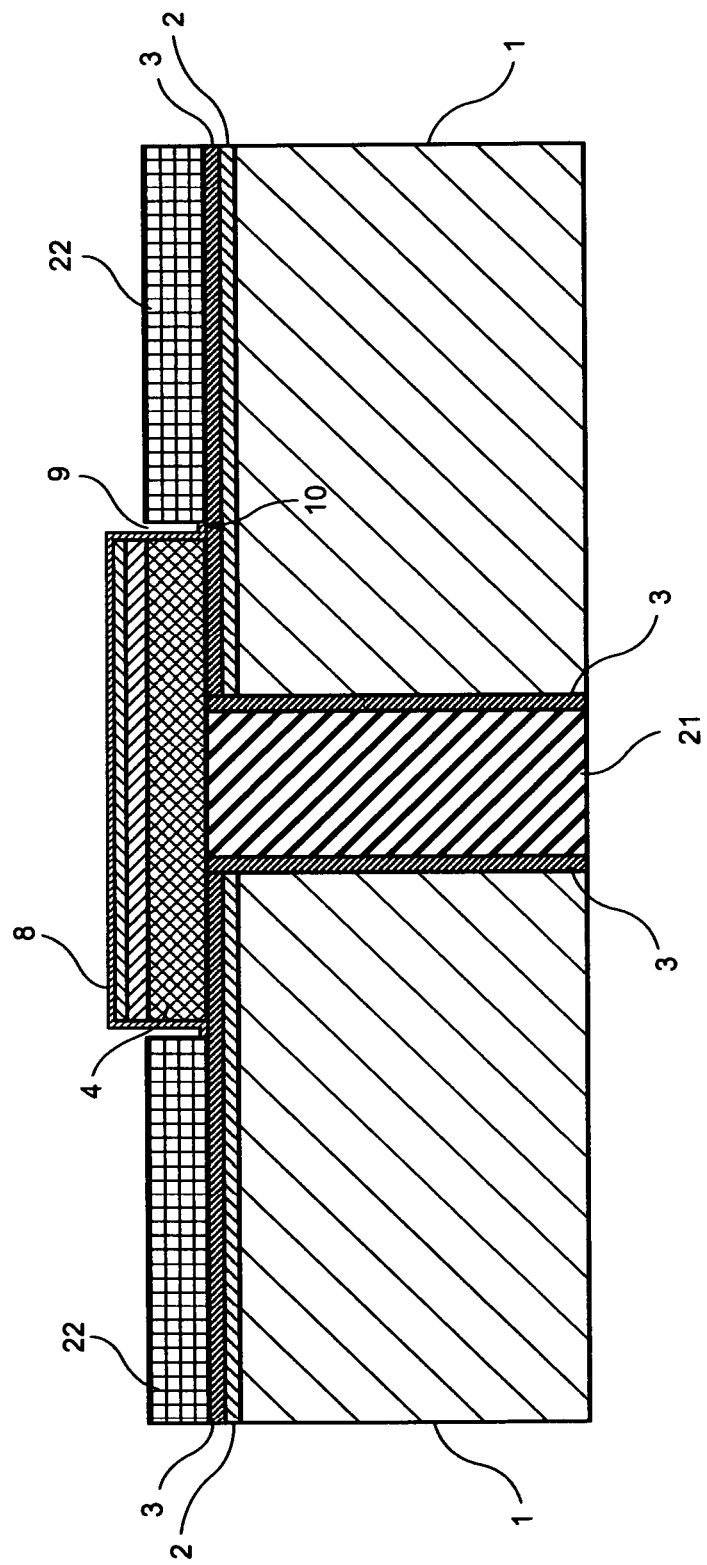
FIGS. 5-6 illustrates a sectional view showing the formation of a first embodiment of the present invention in which a metallic coating is applied to a final surface finish plate which encapsulates the side walls of the wear resistant surface plate, and also covers the side walls of the metal layer plated onto the filled via and on top of a portion of the wrap around plated metal which was plated in the via and onto the surface of the base metal which results in a very slight undercut of panel plated metal and virtually no undercut of the base metal and no undercut of the pattern plated metal as shown in FIG. 6.
Figure 6:
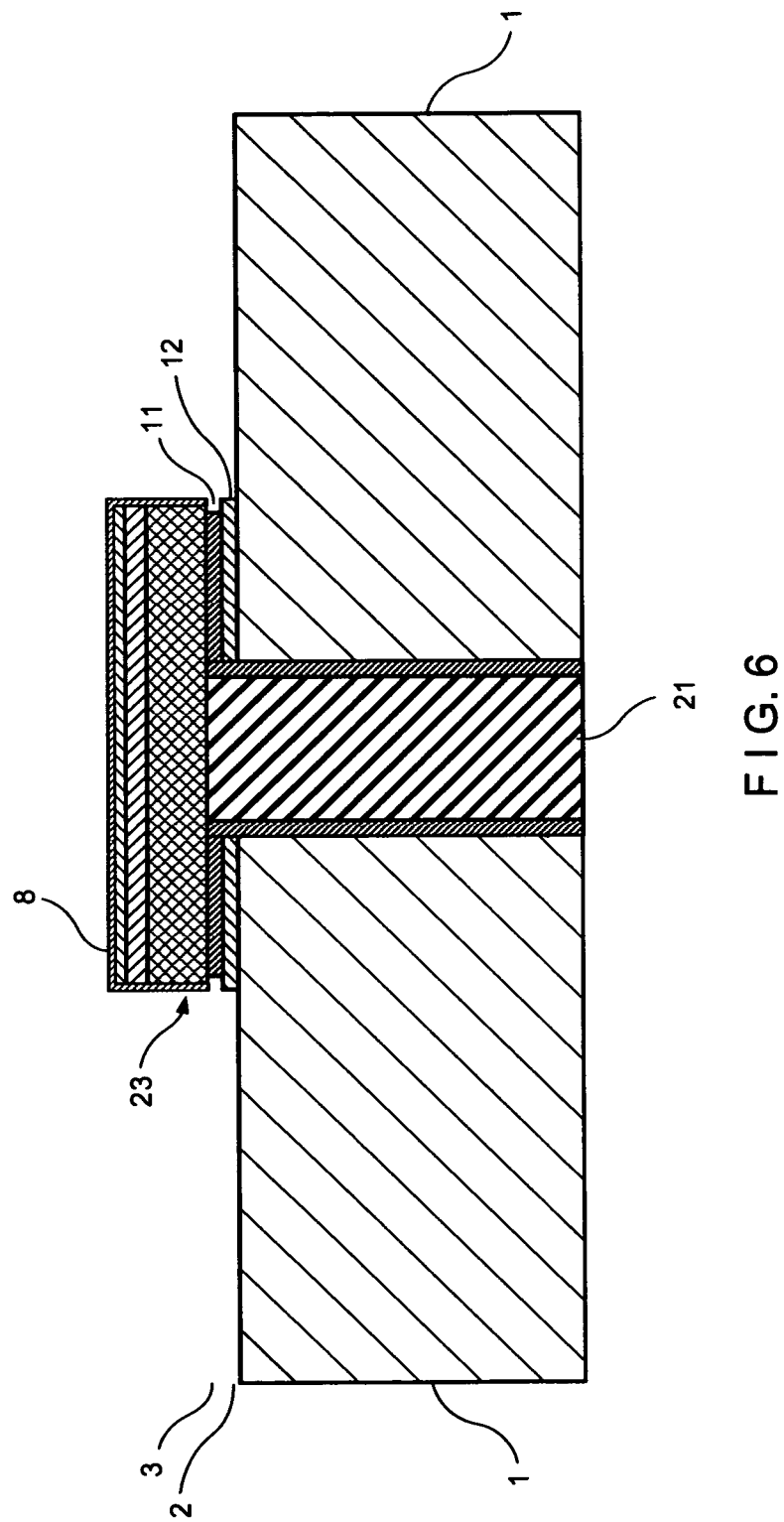
Figure 7:
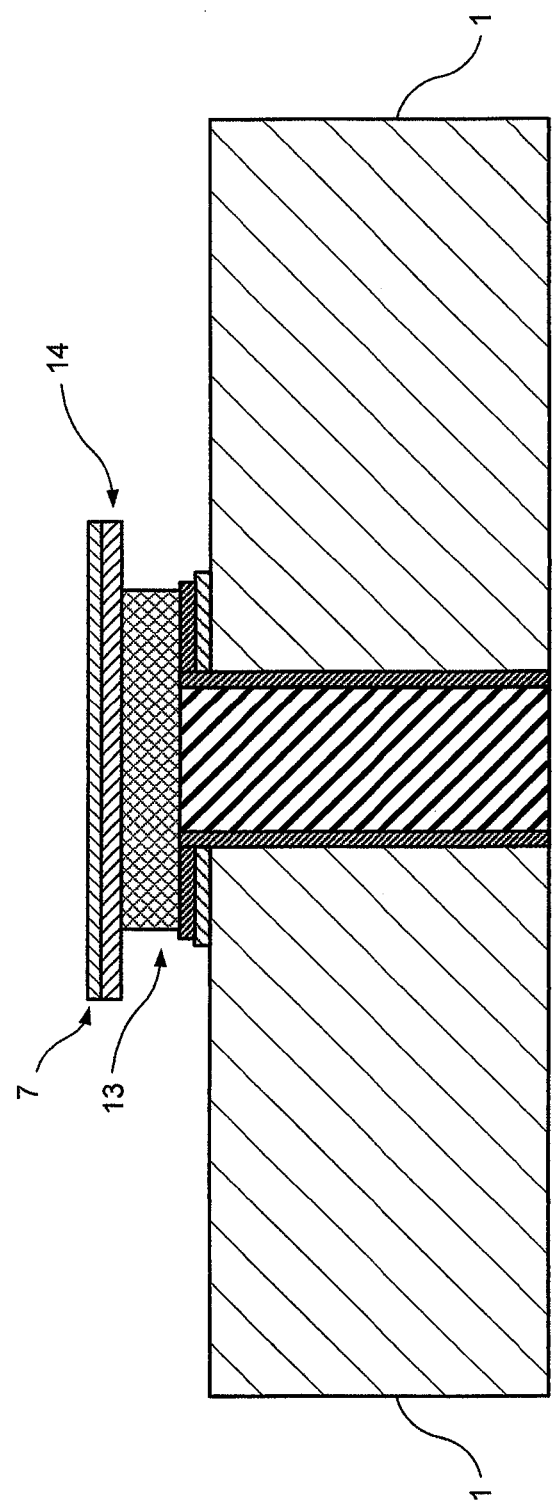

FIGS. 5-6 describe the formation of a first embodiment of the present invention in which a method and an apparatus is provided for forming contact pads 7b on a printed circuit board 1 over plated and filled vias 7. In this first embodiment, an additional metallic layer 8 is formed over the tops and sidewalls of the contact pads 7b. This additional metal layer 8 acts as a final surface finish with suitable wear and contact resistance characteristics common in the electronics industry for contact pads 7b. This will also protect the majority of the sidewalls of the contact pads 7b from the harmful, undercutting effects of the etching process described in FIGS. 1-4 & 7. This is accomplished through modifying the traditional process steps described above in FIGS. 1-4 & 7. Referencing the traditional process steps above, once the pattern plate resist is removed and the board 1 is made ready for etching, another pattern plate photo is applied exposing all surface features having sidewalls that are desired to be protected from the etching process. The positioning of the photo resist opening, in relation to the pads 7b, should be as small as practicable (preferably but not limited to 2-3 mils) in order to allow for complete encapsulation with a plated metal layer 8 (preferably but not limited to gold) over the contact pads down the sidewalls to the plated copper base 2 (FIG. 5). At this point, the photo resist can be removed and the 2-3 mil gold foot at the base of the pads 1b can remain or be removed with a laser ablation step. The board 1 is now ready for etching and the remaining process steps to complete the board 1. Alternatively, the mask step can be eliminated and the final metal layer would need to be selectively removed from a much larger area. As a result of these steps there is a very slight undercut of panel plated metal 11 as shown in FIG. 6.

In the case where a nonmetallic material for coating the sidewalls is used one can use a spray or otherwise apply a liquid resist such as but not limited to a liquid polymer to remove the liquid resist from the base of the pads by means of either photolithography or by laser ablation so that the liquid resist remains on the sidewalls of the top surface, by way of non-limiting example the Au layer of the pads.

Figure 8:
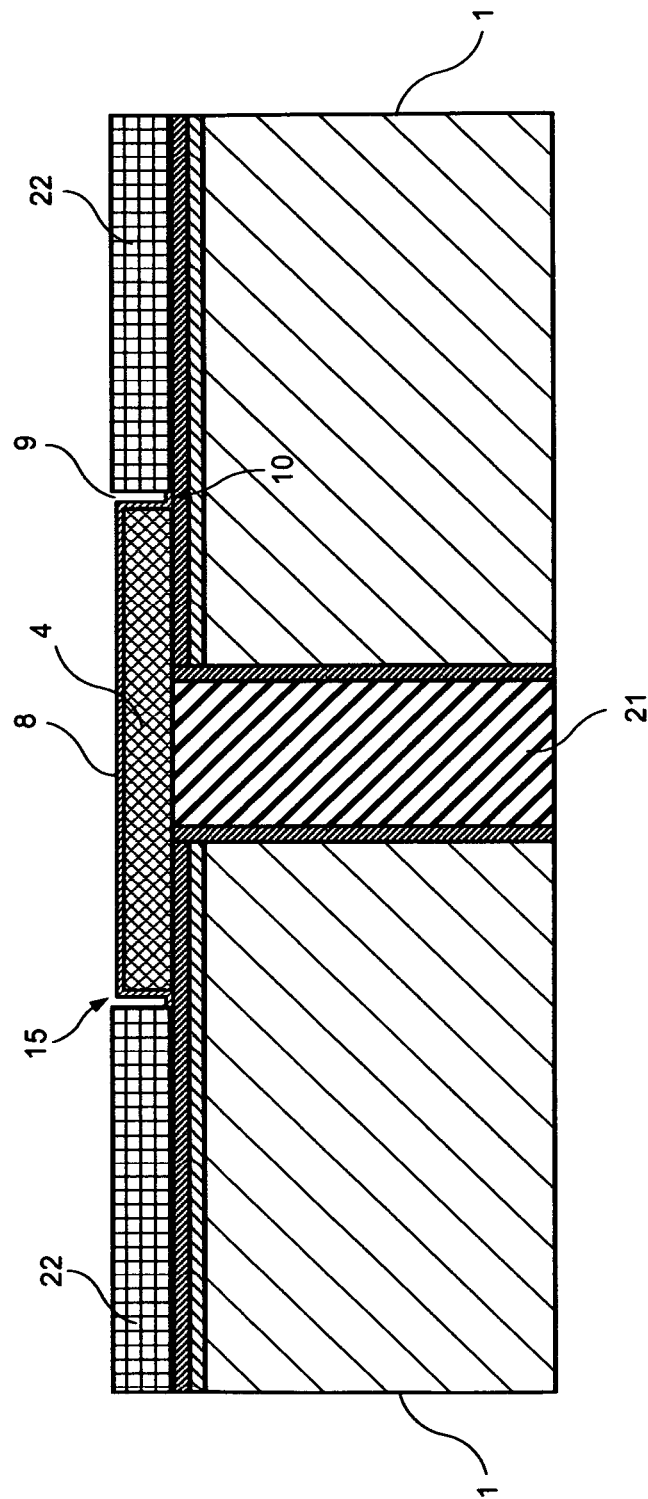
Figure 9B:
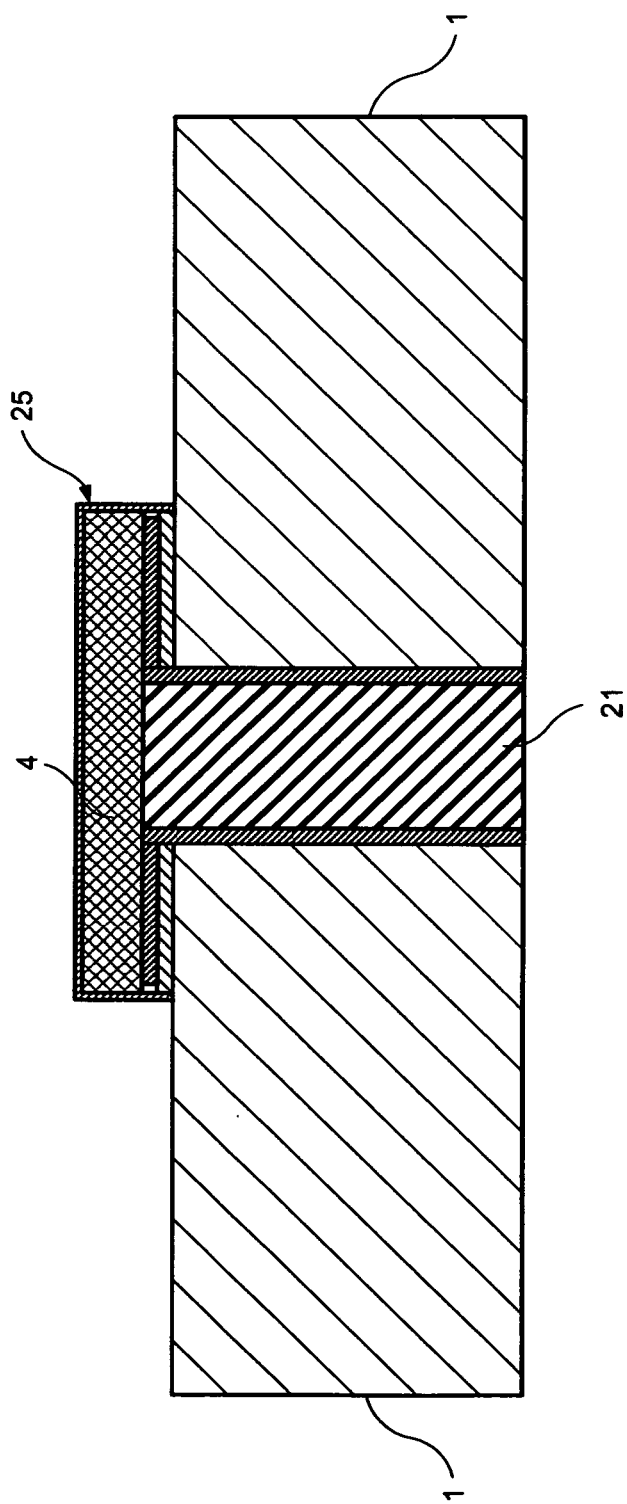

FIGS. 8-9b describe a second embodiment of the present invention in which, in referencing the traditional process steps above, for the case of via-in-pad technology, a blind or through via or hole 7 is formed in a printed circuit board 1 that is subsequently plated with an electro-less plating process to form a thin layer of metallization, or a conductive polymer or other conductive material such as graphite. In the case of electroless copper, the copper is also deposited on the base copper layers of the board's 1 external surface. This is to prepare it for subsequent electro-plating operations. Next, a conductive metal, typically copper, is electro plated in the via 7 and subsequently on the surface of the panel that contains the board 1. Boards 1 are typical built in a larger process panel and then removed from this panel in a later routing step. This plating step is called a "panel plate" step, due to the fact that the entire surface of the panel is plated. Once a sufficient amount of copper is plated in the vias 7 and subsequently on the surface a filling step occurs in which a fill material 7a, typically an epoxy, is filled in the vias 7 and removed from the surface and planerized to the surface in a sanding step.

At this point, an electro-less plating metallization or conductive polymer is formed on the surface of the panel to prepare the planarized epoxy surface for the subsequent electro-plating step. Alternatively, the epoxy fill 7a may contain conductive particles as in but not limited to CB100 from DuPont Corp. that would eliminate or mitigate the need for the previous electro-less step. Next, a plating mask 15, typically a photosensitive mask, is applied to the surfaces of the board 1 and removed just from the areas that will define the final shape of the contact pads 7b and in many cases, all the remaining circuitry. The panel is then electro-plated on the exposed pattern that includes the filled epoxy surface. Additional masks and metal layers of varying shapes and thicknesses may be added at this stage to build-up successive layers of metals. This mask and plate step is typically referred to as the pattern-plating step. After plating metal on the exposed pattern, typically copper, the photoresist is removed prior to adding the final surface finish layers, preferably but not limited to nickel and gold. Then, another photo resist is applied (encapsulation resist) and an area slightly larger than the pattern area, preferably but not limited to 2-3 mils larger, is selectively removed from the pattern area. Next, a temporary etch resistant metal is applied to the exposed areas including the sidewalls of the features. This will protect it from the subsequent etch step. Any temporary etch resist metallization that is applied to the foot of the features can be removed with a laser ablation step. (FIG. 8) This encapsulation photo resist mask is removed and the exposed metallization, typically copper, is then etched away defining the surface circuit pattern 4 yielding a very straight feature sidewall absent of the undercutting effects previously described (FIG. 9). Now the temporary mask encapsulation layer 15 may be stripped away. (FIG. 9a) At which point, a final surface finish may be applied to the pattern 4 in its entirety or selectively, typically, through electro-less or electro plating steps. (FIG. 9B) If electro plated, the circuits must be shorted together through various techniques typically used in the industry. (As an example, etch one side and using the other un-etched side as a shorting block to electrically connect the first side features through the board's vias or alternatively, selectively etching a small-defined area of concern, i.e. end points of traces, with the aforementioned process.)

Alternatively, instead of a temporary metal etch resist, a polymer etch resist could be applied through various techniques, including spin coating electro-plating, spray coating, electro-static spray coating, and other techniques widely know in the art. This coating is applied to the entire three-dimensional surface, including the sidewalls, and selectively removed from the metallization you intend to etch away. This can be selectively removed utilizing photolithographic, laser ablation, or other techniques known in the art.

FIG. 10 illustrates a third embodiment of the present invention substantially similar to the second embodiment except that an unfilled via 7 is utilized with the metallic or non metallic coating 30 applied to the outer surfaces of the plated metal layers 4 which extend around and down into the unfilled via 7.

FIG. 11 illustrates a fourth embodiment of the present invention in which a temporary etch resist 8 is applied to the final surface finish of the contact pads 7b or circuit features and much of its side walls to protect it from the harmful, undercutting effects of the etch process. Being a temporary etch resist 8 the resist is then removed exposing a contact pad 7b or circuit feature with its final finish already in place with predominately straight side walls.

While presently preferred embodiments have been described for purposes of the disclosure, numerous changes in the arrangement of method steps and those skilled in the art can make apparatus parts. Such changes are encompassed within the spirit of the invention as defined by the appended claims.

What is claimed:

1. A structure including contact pads or circuits formed on a printed circuit board (PCB) over a filed or unfilled plated via, comprising:
    either an additional metallic or non-metallic coating that covering to a final surface of a finished plated circuit or pad that encapsulates side walls of a final surface plate, and also covers side walls of a metal layer plated onto a filled or unfilled via and on top of a wrap around plated metal plated in the via and onto the surface of a base metal to provide a slight undercut of panel plated metal and virtually no undercut of the base metal and of the pattern plated metal, preventing subsequent undermining through the etching process and for ensuring that the integrity and reliability of the vias electrical connection when an underlying base metal and the surface plated metal are formed when plating metal in the via and consequently on the surface wherein any excess of said coating around said pad has been removed or limited to prevent shorting of said pad's or circuitry to adjacent pads or circuitry after exposed wrapped plate and base metal layers have been etched.

2. The method according to claim 1 wherein said underlying base metal is copper.

3. A structure including contact pads or circuits formed on a printed circuit board (PCB) over a filed or unfilled plated via, comprising:
an additional metallic or non-metallic coating covering a surface and side walls of a metal layer plated onto a filled or unfilled via and on top of a wrap around plated metal that is plated in the via and onto the surface of a base metal to provide a slight undercut of panel plated metal and virtually no undercut of the base metal and of the pattern plated metal, preventing subsequent undermining through the etching process and for ensuring that the integrity and reliability of the vias electrical connection when an underlying base metal and the surface plated metal are formed when plating metal in the via and consequently on the surface wherein any excess of said coating around said pads or circuits has been removed or limited to prevent shorting of said pad's or circuitry to adjacent pads or circuits after exposed wrapped plate and base metal layers has been etched.

4. The structure according to claim 3 wherein said underlying base metal is copper.

5. A method for forming contact pads or circuits on a printed circuit board (PCB) over a filed or unfilled plated via, the steps comprising:
Applying one of either an additional metallic or non-metallic coating to a final surface of a finished plated circuit or pad encapsulating side walls of a final surface plate, and also covering side walls of a metal layer plated onto a filled or unfilled via and on top of a wrap around plated metal that is plated in the via and onto the surface of a base metal to provide a slight undercut of panel plated metal and virtually no undercut of the base metal and of the pattern plated metal preventing subsequent undermining through the etching process and for ensuring that the integrity and reliability of the vias electrical connection when an underlying base metal and the surface plated metal are formed when plating metal in the via and consequently on the surface and removing or limiting any excess of said coating around said pad to prevent shorting of said pad's or circuitry to adjacent pads or circuitry after etching exposed wrapped plate and base metal layers.

6. The method according to claim 5 wherein said coating is a permanent metal suitable for the circuit or pads end application such as but not limited to gold, palladium or Rhodium.

7. The method according to claim 5 wherein said coating is a metallic temporary etch resist to be removed after etch revealing the final surface finish suitable for the circuit or pads end application such as but not limited to gold, palladium or Rhodium.

8. The method according to claim 7 wherein said temporary etch resist is tin.

9. The method according to claim 7 wherein said coating is a temporary Polymer etch resist to be removed after etch revealing the final surface finish suitable for the circuit or pads end application such as but not limited to gold, palladium or Rhodium.

10. The method according to claim 9 wherein said polymer is a photosensitive polymer selectively removed through photolithography.

11. A method according to claim 9 wherein said polymer is a photosensitive polymer selectively removed through photolithography.

12. The method according to claim 5 wherein said coating is gold.

13. The method according to claim 5 wherein said coating is palladium.

14. The method according to claim 5 wherein said coating is Rhodium.

15. The method according to claim 5 wherein said polymer is applied with spin coating, spray coating, electrostatic spray coating, dip coating, or techniques otherwise known in the art.

16. The method according to claim 15 wherein said polymer is selectively removed through laser ablation or mechanical milling techniques.

17. The method according to claim 5 wherein preventing subsequent undermining through the etching process and for ensuring that the integrity and reliability of the vias electrical connection when an underlying base metal and the surface plated metal are formed when plating metal in the via and consequently on the surface.

18. The structure according to claim 17 wherein said underlying base metal is copper.

19. The method according to claim 5 wherein said underlying base metal is copper.

20. A method for forming contact pads or circuits on a printed circuit board (PCB) over a filed or unfilled plated via, the steps comprising:
Applying one of either an additional metallic or non-metallic coating to a surface and side walls of a metal layer plated onto a filled or unfilled via and on top of a wrap around plated metal that is plated in the via and onto the surface of a base metal to provide a slight undercut of panel plated metal and virtually no undercut of the base metal and of the pattern plated metal, preventing subsequent undermining through the etching process and for ensuring that the integrity and reliability of the vias electrical connection when an underlying base metal and the surface plated metal are formed when plating metal in the via and consequently on the surface, removing or limiting any excess of said coating around said pads or circuits to prevent shorting of said pad's or circuitry to adjacent pads or circuits after etching exposed wrapped plate and base metal layers.

21. A method according to claim 20 wherein said coating is a permanent metal suitable for the circuit or pads end application such as but not limited to gold, palladium or Rhodium.

22. A method according to claim 20 wherein said coating is a metallic temporary etch resist such as but not limited to tin to be removed after etch revealing pads and or circuits ready to accept a suitable final surface finish.

23. A method according to claim 20 wherein said coating is a temporary Polymer etch resist to be removed after etch revealing pads and or circuits ready to accept a suitable final surface finish.

24. A method according to claim 20 wherein said polymer is applied with spin coating, spray coating, electrostatic spray coating, dip coating, or techniques otherwise known in the art.

25. A method according to claim 20 wherein said polymer is selectively removed through laser ablation or mechanical milling techniques.

26. The method according to claim 20 wherein said underlying base metal is copper.

* * * * *